United States Patent [19]

Demmer et al.

[11] Patent Number: 4,694,327

[45] Date of Patent: Sep. 15, 1987

[54] DIGITAL PHASE LOCKED LOOP STABILIZATION CIRCUITRY USING A SECONDARY DIGITAL PHASE LOCKED LOOP

[75] Inventors: Walter H. Demmer, Plainsboro Township, Middlesex County; Leopold A. Harwood, Bridgewater; Chandrakant B. Patel, Hopewell; Alvin R. Balaban, Lebanon, all of N.J.

[73] Assignee: RCA Corporation, Princeton, N.J.

[21] Appl. No.: 845,850

[22] Filed: Mar. 28, 1986

[51] Int. Cl.⁴ .............................................. H04N 9/45
[52] U.S. Cl. ......................................... 358/19; 358/23
[58] Field of Search ..................... 358/13, 19, 23, 21 R

[56] References Cited

U.S. PATENT DOCUMENTS

| 3,578,902 | 5/1971 | Monsay | 178/5.4 |
|---|---|---|---|
| 4,349,833 | 9/1982 | Clarke | 358/23 |
| 4,476,490 | 10/1984 | Kaneko | 358/148 |
| 4,488,170 | 12/1984 | Nillesen | 358/26 |
| 4,500,404 | 2/1985 | Machida | 358/17 |
| 4,504,799 | 3/1985 | Elmis et al. | 331/1 A |
| 4,506,175 | 3/1985 | Reitmeier et al. | 307/525 |

FOREIGN PATENT DOCUMENTS 3432313 3/1986 Fed. Rep. of Germany ....... 358/19

OTHER PUBLICATIONS

Gruen, Wolf J., Theory of AFC Synchronization, Proceedings of the IRE, Aug. 1953, pp. 1043-1048.
"Digital Video Signal Processing", Philips Publication 9398 332 60011, Feb. 1986.

Primary Examiner—John W. Shepperd
Attorney, Agent, or Firm—E. M. Whitacre; P. J. Rasmussen; K. N. Nigon

[57] ABSTRACT

A digital television receiver includes a first phase locked loop which develops a sampling clock signal that is locked to the horizontal line synchronizing signal components of a composite video signal. A second digital phase locked loop is clocked by the sampling clock signal and develops a digital signal that is phase locked to the color burst signal. This digital signal is used as a regenerated color subcarrier signal to synchronously demodulate the chrominance components of the composite video signals into I and Q color difference signals. To compensate for frequency instability in the regenerated subcarrier signal caused by frequency instabilities in the line-locked clock signal, a third digital phase locked loop develops an output signal which is phase locked to a reference signal generated by a crystal controlled oscillator. Control signals from the third phase locked loop are applied to the second phase locked loop to substantially compensate for frequency instabilities in the regenerated subcarrier signal that are induced by the clock signals.

9 Claims, 6 Drawing Figures

Fig. 1A
PRIOR ART
DISCRETE TIME OSCILLATOR

DIGITAL PHASE LOCKED LOOP STABILIZATION CIRCUITRY USING A SECONDARY DIGITAL PHASE LOCKED LOOP

This invention relates to circuitry for reducing frequency instability in a digital phase locked loop that is controlled by a clock signal which may be unstable.

A digital phase locked loop (PLL) includes a variable digital oscillator which generates oscillatory signals that may be locked in frequency and phase to a reference signal. The frequency and phase of the signal produced by the digital PLL may depend on the frequency of the clock signal applied to the digital oscillator as well as on the frequency and phase of the reference signal.

Figure 1A:
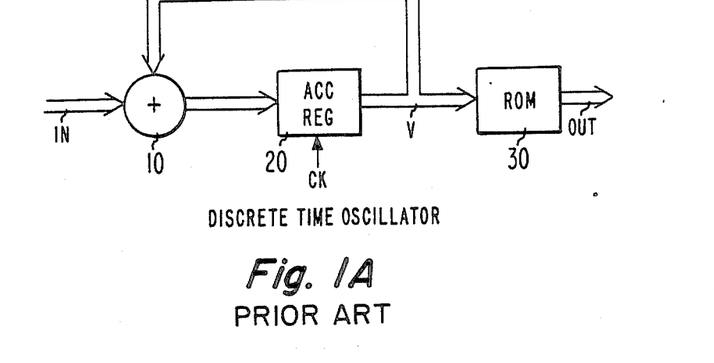
FIG. 1A (prior art) is a block diagram of a discrete time oscillator and FIGS. 1B and 1C are waveform diagrams useful in explaining the operation of a discrete time oscillator.

For example, consider the digital phase locked loop used to regenerate the chrominance subcarrier signal in a line-locked digital television receiver. An exemplary system of this type is described in U.S. Pat. No. 4,349,833 entitled "Apparatus For Digital Demodulation or Modulation of Television Chrominance Signals", which is hereby incorporated by reference. Briefly, the system includes a discrete time oscillator (DTO), similar to the one shown in FIG. 1A for regenerating a digital chrominance subcarrier signal locked in phase to the color reference burst component of the composite video signal. The oscillator has three components, an adder 10, accumulator register 20 and a read only memory (ROM) 30. The value held by the accumulator register is incremented by an input signal, IN, coincident with the leading edge of each pulse of the clock signal, CK. The output values of the accumulator register 20 are applied as addresses to the ROM 30. ROM 30 is programmed to provide a periodic output function, for example, a sine wave, as an output signal, OUT, in response to the address values provided by the accumulator register. Assuming that M-1 is the largest value which may be held in the accumulator register 20, and that an increment signal, IN, is applied to the DTO. The frequency of the signal produced by the DTO ($f_{DTO}$) may be expressed as:

$$f_{DTO} = (IN/M) f_{CK}. \quad (1)$$

Figure 1B:
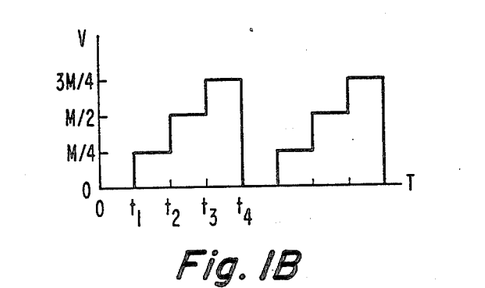
Figure 1C:
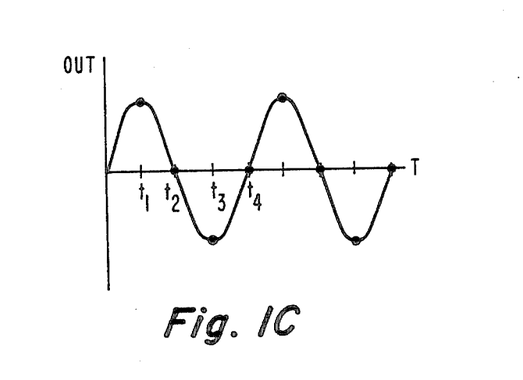

Examples of the signals V and OUT developed by the DTO when $IN/M = \frac{1}{4}$ are shown in FIGS. 1B and 1C respectively. The points on the sinusoidal waveform shown in FIG. 1C represent the output values provided by the ROM 30 responsive to the addresses, V, (shown in FIG. 1B) developed in the accumulator register 20.

When a DTO is used in a digital PLL, the range of values which may be held in the accumulator register (i.e. the modulus of the accumulator) and the frequency of the clock signal, $f_{CK}$, are assumed to be invariant so that the frequency of the signal provided by the DTO may be changed only by changing the increment value In applied to the input terminal of the DTO. In the U.S. Pat. No. 4,349,833 referenced above, the input signal applied to the DTO is determined by the detected phase difference between the reconstructed color subcarrier signal produced by the DTO and the color reference burst signal component of the received video signals. This phase difference signal is applied to a low-pass filter, the output signal of which is used to change the input value to the DTO so that the frequency and phase of the signal provided by the DTO remain locked to the burst signal.

As set forth above, a basic assumption for this type of digital PLL is that the clock frequency is invariant. This assumption may not be valid if the clock signal is generated by a PLL which locks to the horizontal line synchronizing signal components of the input video signals (a line locked PLL) and if the input video signals are derived from a nonstandard source such as a video tape recorder (VTR) or video disc player. The signal provided by a non-standard source generally has relatively stable color burst signal components but may have horizontal line synchronizing signal components which vary significantly in frequency from line to line. This variation may be caused by stretching of the tape, defects in the disc, or motor speed variations in either the VTR or disc player. The frequency of the clock signal generated by a line locked PLL will change to track the changes in the frequency of the horizontal line synchronizing signal. The time constant of the PLL which generates the line locked clock signal is generally relatively short, on the order of ten or fifteen horizontal line periods, for example. This relatively short time constant allows the system to track the changing line frequency rapidly, to keep the number of samples per line substantially constant throughout a field or frame. This feature is desirable in television signal processing systems which include field or frame store memories.

However, this tracking feature may cause sufficient variation in the frequency of the clock signal to cause color signal distortion in television systems which use a digital PLL to regenerate the color subcarrier signal.

The color subcarrier frequency for composite video signals is relatively stable since it is generated by a crystal controlled oscillator either at the transmitter or in the VTR or disc player. The color information in the video signal is quadrature amplitude modulated with respect to this color subcarrier frequency. To demodulate this signal, it is desirable for the regenerated subcarrier signal developed by the PLL to closely match the original subcarrier signal in frequency and phase. Since the color subcarrier signal is suppressed in a standard composite video signal, the PLL which regenerates the color subcarrier signal locks to the color reference burst components of the video signals. These components occur only during a small portion of each horizontal line. Consequently, it is desirable for the color subcarrier PLL to accumulate phase errors over a relatively large number of horizontal line periods to ensure that any measured phase error is accurate and uncontaminated by noise in the video signal. Thus, the color subcarrier PLL preferably has a much longer time constant than the line locked PLL which generates the system clock signal. This time constant may be on the order of one frame period, for example.

Because of the difference in the loop time constants and because the frequency of the signal produced by the digital color subcarrier PLL depends on the frequency of the clock signal, the combination of the two PLL's may cause instabilities in the regenerated color subcarrier signal. This instability may even cause the color subcarrier PLL to lock at the wrong frequency.

SUMMARY OF THE INVENTION

The present invention is circuitry to stabilize the frequency of a signal generated by a digital oscillator that is clocked by a signal having frequency instabilities. The stabilizing circuitry includes an oscillator which generates a signal having a predetermined frequency. The output signal of this oscillator is applied to a digital PLL which includes a phase detector, low-pass filter and a discrete time oscillator. The phase detector compares the signal developed by the oscillator to that developed by the discrete time oscillator and provides a signal that is proportional to the difference in phase between the two signals. This phase difference signal is applied to a low-pass filter which has a time constant that is sufficient to accurately track the instabilities in the frequency of the clock signal. The output signal of the low-pass filter is applied as a correction signal to the discrete time oscillator and to the digital oscillator.

DETAILED DESCRIPTION

In the drawings, broad arrows represent busses for multiple-bit parallel digital signals and line arrows represent connections carrying analog signals or single bit digital signals. Depending on the processing speed of the devices, compensating delays may be required in certain of the signal paths. One skilled in the art of digital circuit design would know where such delays would be needed in a particular system.

Figure 2:
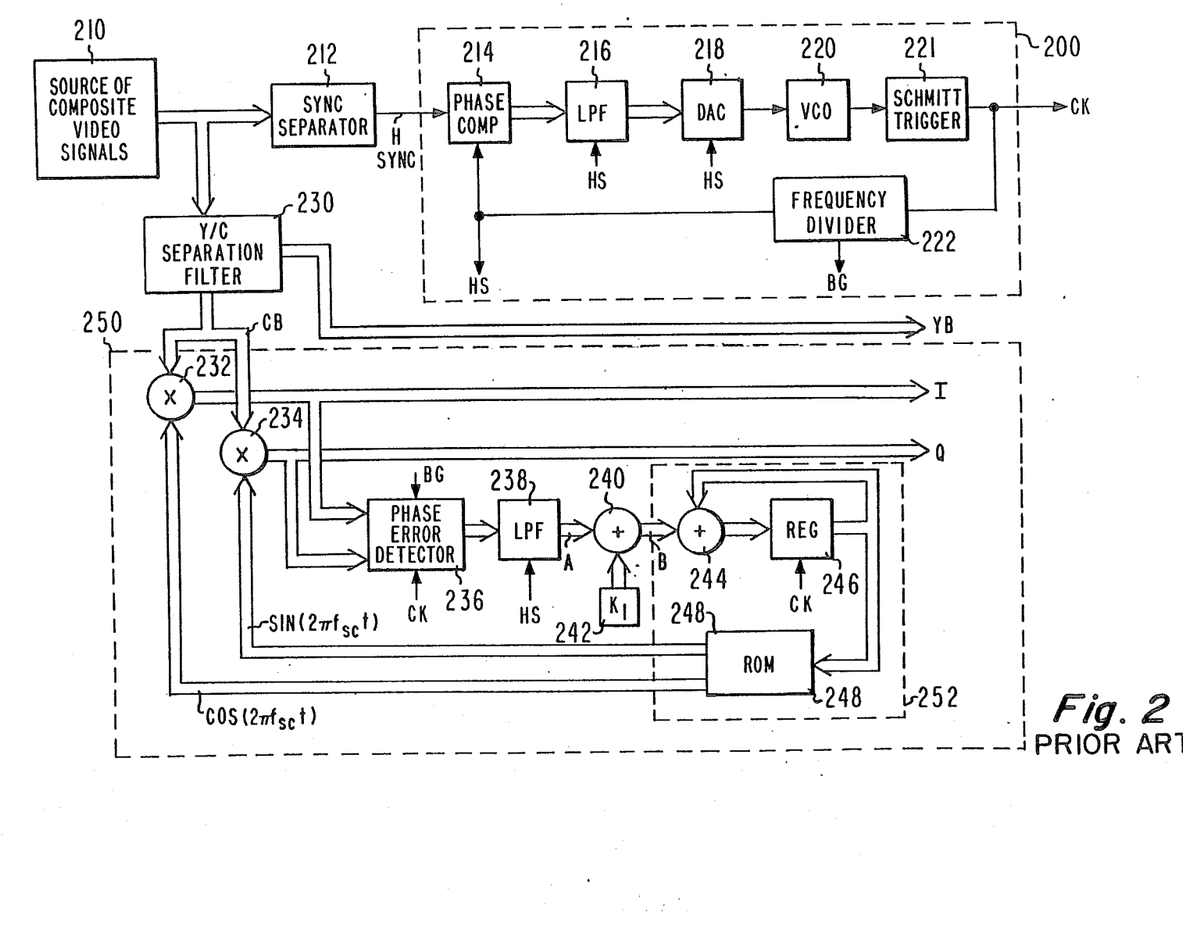
FIG. 2 (prior art) is a block diagram of a portion of a digital television receiver.

FIG. 2 is a block diagram of a portion of a television signal processing system which includes first and second PLL's 200 and 250 respectively. The PLL 200 develops a sampling clock signal, CK, which is phase locked to the horizontal line synchronizing signal components of the incoming video signal. The PLL 250 is a digital PLL, clocked by the sampling clock signal CK, which develops digital signals representing the color subcarrier signal at a predetermined phase and a signal that is quadrature phase related to this signal. These two signals are used to synchronously demonstrate the chrominance signal components of the incoming video signals to develop two quadrature phase related color difference signals.

In FIG. 2, a source of composite video signals 210, which may, for example, include the tuner, IF amplifier, video detector and analog to digital converter of a conventional digital television receiver, provides digitized composite video signals to sync separator circuitry 212. The circuitry 212, for example, develops a signal, HSYNC, representing the horizontal line synchronizing signal component of the composite video signals. The signal HSYNC is applied to one input terminal of a phase comparator 214. An internally generated horizontal line synchronizing signal, HS, is applied to a second input terminal of the phase comparator 214. The circuitry which develops the signal HS is described below. Phase comparator 214 may, for example, be similar to the circuitry described in U.S. Pat. No. 4,506,175 entitled "Digital Phase Comparator Circuit Producing Sign and Magnitude Outputs" which is hereby incorporated by reference. The signal provided by the phase comparator 214 may be, for example, the time delay between the leading edges of the respective pulse signals HSYNC and HS. This signal has positive values when the leading edges of the HSYNC pulses occur before the leading edges of the HS pulses and negative values when the leading edges of the HSYNC pulses occur after the leading edges of the HS pulses.

Figure 4:
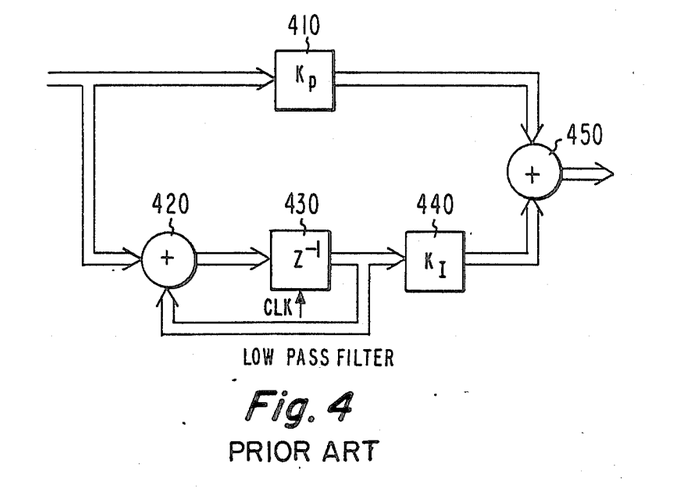
FIG. 4 (prior art) is a block diagram showing the structure of exemplary low-pass filters for use in FIGS. 2 and 3.

The signal provided by the phase comparator circuitry 214 is applied to a low-pass filter 216. Filter 216 is the loop filter of the PLL 200. An exemplary structure for this filter is shown in FIG. 4. In FIG. 4, input signals are applied to a scaling circuit 410 which multiplies the input values by a scale factor $K_p$. The digital signals developed by the scaling circuit 410 are applied to one input port of an adder 450. The input signals to the filter are also applied to one input port of an adder 420 which, with the delay element 430, forms an integrator. The output port of the adder 420 is connected to the input port of the delay element 430, the output port of which is connected to the second input port of the adder 420. Delay element 430 may be, for example, a synchronous latch that is clocked by a signal CL (i.e., the horizontal line synchronizing signal HS) to provide a sample delay interval of one period of the signal CLK. The signal provided by the delay element 430 is the integrated input signal (i.e. the integrated phase difference between HSYNC and HS). This signal is applied to a scaling circuit 440 which multiplies the integrated signal by a factor $K_I$. The output signal of the scaling circuit 440 is applied to the second input port of the adder 450. The signal developed by the adder 450 is the output signal of the low-pass filter. The low-pass filter shown in FIG. 4 is a digital embodiment of a conventional proportional plus integral control network where the factors $K_P$ and $K_I$ correspond to the proportional gain and the integral gain of the network respectively. The values of the factors $K_P$ and $K_I$ depend on the desired time constant and damping factor of the PLL and upon the gains of the other elements in the loop. Filters of this type are commonly used as loop filters in PLL's.

Referring to FIG. 2, the low-pass filtered phase difference signals provided by the filter 216 are applied to a digital to analog converter (DAC) 218. DAC 218 develops analog potential values representing the filtered phase difference signals and applies these values at a horizontal line rate to a voltage controlled oscillator (VCO) 220. The VCO 220, which may be of conventional design, produces a sinusoidal output signal having the same frequency as the sampling clock signal, CK. The VCO 220 is tuned to have a free running frequency of R times $f_H$. In the present embodiment, R is the ordinal number of a harmonic of the horizontal line frequency, $f_H$, which approximates a multiple of the color subcarrier frequency. For example, in the NTSC system, the frequency, $f_{SC}$, of the color subcarrier signal is the 455th harmonic of one-half of the horizontal line frequency, and the frequency, $f_{ck}$, of the sampling clock signal, CK, is four times the frequency of the color subcarrier signal ($4f_{SC}$). So the VCO used in this embodiment has a free-running frequency of approximately 910 times the horizontal line frequency (R=910).

The sinusoidal output signal of the VCO is applied to Schmitt trigger circuitry 221 which develops the square wave clock signal CK having the frequency, $f_{CK}$, equal to $Rf_H$. The signal CK is applied to frequency dividing circuitry 222. Circuitry 222 divides the frequency of the signal CK by R to develop a signal HS having a frequency substantially equal to $f_H$. As set forth above, the signal HS is applied to the second input terminal of the phase comparator 214.

The circuitry 222 may, for example, include a 10-bit counter (not shown) which is configured to be reset when a count value of 910 is achieved. The frequency dividing circuitry 222 may further include circuit elements (not shown) coupled to the counter to detect count values corresponding to the beginning and end of the burst interval and for generating a burst gate signal, BG, which spans the time interval defined by those count values in each horizontal line period.

The PLL 200 generates a clock signal, CK, which tracks the varying line frequency of a non-standard signal to provide a substantially uniform number of sampling clock pulses per line. In the present embodiment, the gain factors of the phase comparator 214, low-pass filter 216, DAC 218, VCO 220, Schmitt trigger 221 and frequency divider circuitry 222 are selected to achieve a filter time constant of approximately 15 horizontal line periods and a damping factor of 2. These gain values depend on the circuit elements to be used in the PLL and may be readily calculated by one skilled in the art of phase-locked loop design. An explanation of the relationship between the gain values, the damping factor and the PLL time constant may be found in Gruen, W. J. "Theory of AFC Synchronization" Proceedings of the IRE, August 1953, pp. 1043–1048, which is hereby incorporated by reference.

Composite video signals from source 210 are also applied to Y/C separation filter circuitry 230. Circuitry 230 may include, for example, a low-pass filter and a band-pass filter for separating the respective luminance and chrominance signal components from the composite video signals. The luminance and chrominance signals are available at the output busses YB and CB of the circuitry 230 respectively.

The separated chrominance components are applied to multipliers 232 and 234 which, using signals provided by the PLL 250, demodulate the chrominance signals into two quadrature phase related baseband color difference signals, for example, I and Q.

The color difference signals are applied to a phase error detector 236. The phase error detector 236 develops an output signal representing the difference between the phase of the demodulated color reference burst signal and a reference phase value. The phase error detector 236 may include, for example, circuitry (not shown) to separately accumulate baseband I and Q sample values during the burst interval and to divide the accumulated I values by the accumulated Q values to develop values representing the phase of the burst signal relative to the sampling instants of the I and Q samples. These values may be subtracted from a reference value representing the desired burst phase to generate a phase error value to control the PLL 250. The phase error values developed by the detector 236 are applied to a low-pass filter 238. Filter 238 is clocked by the signal HS generated by the PLL 200 and may be similar to the filter 216 except for the values of the proportional and integral gain factors, $K_P$ and $K_I$ respectively. The filtered phase error signal, A, provided by the filter 238 is applied to one input port of an adder 240. A fixed increment value, $K_1$, supplied by a source 242, is applied to the other input port of the adder 240. The signal, B, developed by the adder 240 is applied as the input increment value to a DTO 252 which includes an adder 244, an accumulator register 246 and a ROM 248. The ROM 248 is programmed to provide, at respective first and second output ports, the cosine and sine of the values applied to its address input port, normalized to $2\pi$ radians. These signals, which in the present embodiment are the cosine and sine of $2\pi f_{sc} t$ respectively, are applied to the respective multipliers 232 and 234, as set forth above, to synchronously demodulate the chrominance signal to recover the two quadrature phase related color difference signals.

In the steady state, when there is no difference between the phase value of the demodulated burst signal and the reference phase value, the frequency of the signal developed by the DTO is determined by the number of bits in the accumulator register 246, the increment value $K_1$ supplied by the source 242, and by the frequency of the clock signal CK. Assuming that the register 246 is an twenty-bit register and that the frequency of the clock signal CK is equal to $4f_{SC}$, a $K_1$ equal to 262,144 (i.e. $2^{18}$) produces an output signal having a frequency of $f_{SC}$. In dynamic operation, when the burst phase does not match the reference phase, the phase error values provided by the detector 236 are accumulated by the low-pass filter 238 to develop a correction term which is added to the value $K_1$ by the adder 240 to produce an input increment or frequency control signal which changes the frequency of the DTO in a sense that tends to reduce the phase error.

As set forth above, it is desirable for the time constant of the PLL 250 to be relatively long to reduce the effects of noise and to provide a high level of phase accuracy for the signals applied to the synchronous demodulating multipliers 232 and 234. In the present embodiment, for example, the gain factors of the various circuit elements in the PLL are set to values which produce a loop time constant of approximately one frame period (1/30th of a second for NTSC signals). Since the time constant of the PLL 250 is much longer than the time constant of the PLL 200, the PLL 250 may not be able to track frequency changes in the regenerated subcarrier signal that are induced by changes in the frequency of the clock signal, CK. This deficiency in the system shown in FIG. 2 may cause random errors in the I and Q color difference signals or may cause the PLL 250 to generate a color subcarrier signal having the wrong frequency, locked to the wrong harmonic of the line frequency.

To understand this problem more completely, consider the PLL correction signals A and B. When the signals applied to the television receiver are from standard sources (e.g. broadcast signals) and the PLL 250 is locked to the color reference burst signal, the clock signal CK and regenerated subcarrier signal developed by the DTO are at their nominal frequencies, $f_{ck\ nom}$ and $f_{sc\ nom}$ respectively. Accordingly, the equation (1) may be restated as $$IN/M = f_{sc\ nom}/f_{ck\ nom}. \qquad (2)$$

In relation to FIG. 2, the input increment signal, IN, corresponds to the correction signal B. When the PLL 250 is locked to burst, the signal A is zero valued. In this instance, the input increment signal, B, applied to the DTO 252 is the value $K_1$. Consequently, $$B = K_1 = M\ f_{sc\ nom}/f_{ck\ nom}. \qquad (3)$$

In the non-locked condition, the frequency of the signal provided by the DTO 252 differs from $f_{sc\ nom}$ by some value $\Delta f_{sc}$ and the signal A is non-zero. In this instance, the equation (3) becomes:

$$B = A + K_1 = M(F_{sc\ nom} + \Delta f_{sc})/f_{ck\ nom}. \quad (4)$$

from which it may be deduced that:

$$A = M\Delta f_{sc}/f_{ck\ nom}. \quad (5)$$

B is the input increment signal to the DTO. Substituting the equation (4) in the equation (1) yields:

$$f_{DTO\ 252} = (f_{sc\ nom} + \Delta f_{sc})f_{ck}/f_{ck\ nom}. \quad (6)$$

Thus, even when the PLL 250 has locked to the color burst signal and the term $\Delta f_{sc}$ becomes zero, the frequency of the signal generated by the DTO 252 may change by the factor $f_{ck}/f_{ck\ nom}$, the actual clock frequency divided by the nominal clock frequency.

Figure 3:
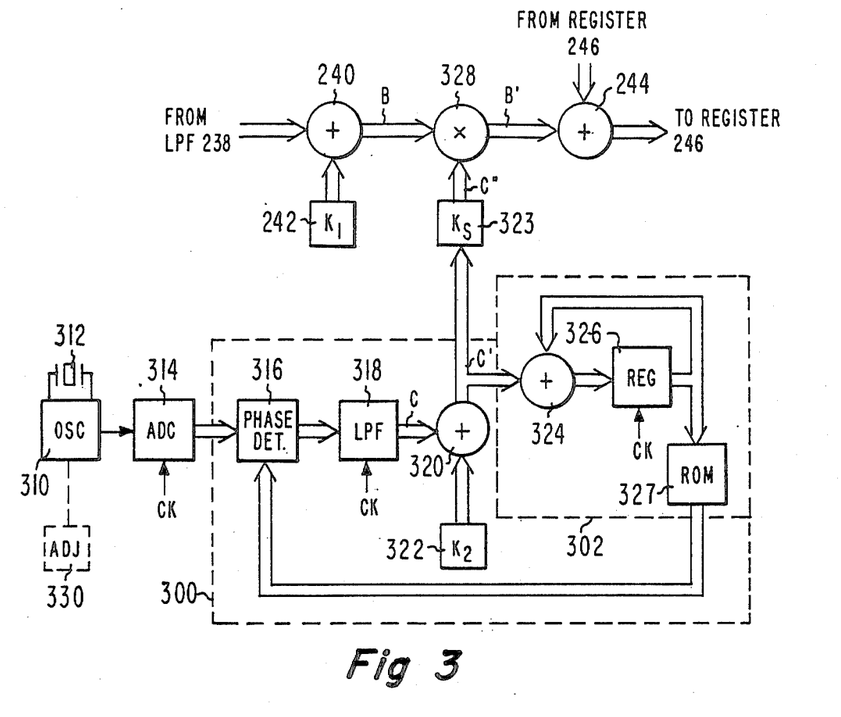
FIG. 3 is a block diagram of circuitry embodying the present invention which may be used with the portion of the television receiver shown in FIG. 2.

FIG. 3 is a block diagram of circuitry which embodies the present invention. This circuitry modifies the signal B to develop a signal B' which is an input increment signal that allows the signal generated by the DTO to be substantially independent of changes in $f_{ck}$.

The circuitry includes an oscillator 310 which develops a sinusoidal output signal having a frequency $f_{xtl}$ determined by the resonant crystal 312. The frequency of the signal generated by the oscillator may be fine tuned via the optional adjustment 330 (shown in phantom), the function of which is described below. The output signal of the oscillator is applied to an analog-to-digital converter (ADC) 314. ADC 314, which may, for example a four-bit flash ADC, samples the sinusoidal signal at instants determined by the clock signal CK to develop digital signals for application to a phase detector 316. In addition to the phase detector 316, the PLL 300 also includes a low-pass filter 318, adder 320, digital value source 322, and a DTO 302 which includes an adder 324, an accumulator register 326 and a ROM 327. This PLL develops, for example, a four-bit digital signal at the output port of the ROM 327 that is locked in frequency and phase to the signal developed by the oscillator 310. The phase detector 316 compares the signal provided by the ROM 327 to the signal provided by the ADC 314. After the PLL 300 has initially locked to the reference signal, the phase difference signal developed by the phase detector 316 represents changes induced by the clock signal. This phase difference signal is applied to a low-pass filter 318. Filter 318 is the loop filter of the PLL 300 and may, for example, be of the same design as the filters 216 and 328 described above. The integral and proportional gain factors of the filter 318 are set, along with the gain constants of the other elememts in the loop to provide a loop time constant that is less than or approximately equal to the time constant of the PLL 200 (i.e. fifteen horizontal line periods). The filtered phase difference signal provided by the filter 318 is added to a fixed digital value, $K_2$, from a source 322, by the adder 320. The signal provided by the adder 320 is applied as the input increment signal to the DTO 302 as set forth above. The output signal of the DTO 302 is applied to the phase detector 316 to complete the feedback loop.

The following is a more detailed analysis of the operation of the PLL 300. The frequency, $f_{xtl}$, of the reference signal is substantially constant since it is generated by a crystal controlled oscillator. Consequently, the phase difference signals developed by the phase detector 316 and the phase correction signals developed by the low-pass filter 318 are proportional to the frequency and phase differences in the signal generated by the DTO 302 relative to the signal produced by the crystal oscillator. These frequency and phase differences are induced by the frequency instabilities in the clock signal CK. Thus, when the signals received via source 210 are from standard sources, the output signal C of the low-pass filter 318 is zero valued and the input increment signal to the DTO 302 is the digital value $K_2$ provided by the source 322. Using analysis similar to that set forth above in reference to the PLL 250, the value $K_2$ may be described by the equation (7).

$$K_2 = Nf_{xtl}/f_{ck\ nom} \quad (7)$$

where the number N is one greater than the largest number that can be stored in the accumulator register 326.

When the signals received via the source 210 are from non-standard sources, however, the frequency of the clock signal CK may vary from the nominal value $f_{ck\ nom}$ by an amount $\Delta f_{ck}$, so the signal C is non-zero. To ensure that the PLL 300 accurately tracks the changing clock frequency, it is desirable that the factor $f_{ck\ nom}$ in the equation (7) be replaced by the factor $(f_{ck\ nom} + \Delta f_{ck})$. This replacement produces the equation:

$$C' = C + K_2 = Nf_{xtl}/(f_{ck\ nom} + \Delta f_{ck}). \quad (8)$$

Multiplying the right-hand side of the equation (8) by $f_{ck\ nom}/f_{ck\ nom}$ yields:

$$C + K_2 = Nf_{xtl}f_{ck\ nom}/(f_{ck\ nom} + \Delta f_{ck})f_{ck\ nom}. \quad (9)$$

Replacing the numerator factor, $f_{ck\ nom}$, in the equation (9) by $f_{ck\ nom} + \Delta f_{ck} - \Delta f_{ck}$ yields:

$$C + K_2 = Nf_{xtl}/f_{ck\ nom} - Nf_{xtl}\Delta f_{ck}/(f_{ck\ nom} + \Delta f_{ck})f_{ck\ nom}. \quad (10)$$

From the equation (10), it can be deduced that $$C = -Nf_{xtl}\Delta f_{ck}/(f_{ck\ nom} + \Delta f_{ck})f_{ck\ nom}. \quad (11)$$

The equation 11 describes the frequency difference signal provided by the low-pass filter 318 in response to the phase difference signals provided by the phase detector 316.

The signal C', the sum of C and $K_2$, when applied as the input increment signal to the DTO 302 causes the DTO 302 to accurately track the changes in $f_{ck}$ and, maintain the frequency of the signal provided by the DTO 302 substantially equal to $f_{xtl}$.

The signal C' is scaled by scaling circuitry 323 by a factor $K_S$ which satisfies the equation (12).

$$K_S = f_{ck\ nom}/(N f_{xtl}) \quad (12)$$

to produce a stabilizing signal C" which is described by the equation (13).

$$C'' = f_{ck\ nom}/f_{ck}. \quad (13)$$

The signal B, provided by the adder 240 in FIG. 2, is multiplied by the stabilizing signal C" in the multiplier 328 to develop a signal B' satisfying the equation (14).

$$B' = M(f_{sc\ nom} + \Delta f_{sc})/f_{ck}. \quad (14)$$

When B' is substituted for B as the input increment signal of the DTO 252, the equation (6) becomes $$f_{DTO\ 252} = f_{xc\ nom} + \Delta f_{xc}. \quad (15)$$

So the frequency of the signal provided by the PLL 250 is substantially independent of the frequency of the clock signal CK.

In the present embodiment, the frequency $f_{xtl}$ may have any predetermined value within the Nyquist limit of the sampling clock signal CK. It is preferable, however, that the system be designed to operate at a particular frequency since the digital constant factor $K_S$ includes a factor of $1/f_{xtl}$. The frequency $f_{xtl}$ may be set to the predetermined value either by using a very accurate resonant crystal 312 or by using the optional frequency adjustment circuitry 330 in the oscillator 310 and using a less accurate crystal.

What is claimed is:

1. Apparatus comprising:
   a terminal for applying a clock signal which exhibits frequency instabilities;
   a source of first reference signal having a predetermined frequency;
   a digital oscillator responsive to said clock signal and to a first frequency control signal for developing an output signal having substantially the same frequency as said first reference signal, wherein the frequency instabilities in said clock signal tend to induce corresponding frequency instabilities in said output signal;
   a source of second reference signal having a frequency substantially equal to a further predetermined frequency;
   a digital phase locked loop, responsive to said clock signal for developing an oscillatory signal having substantially the same frequency as said second reference signal, including circuitry for developing a second frequency control signal which substantially compensates said phase locked loop for frequency instabilities in said oscillatory signal related to frequency instabilities in said clock signal; and
   means, coupled to said digital phase locked loop for generating a stabilizing control signal proportional to said second frequency control signal;
   means coupled to said digital oscillator for multiplying the first frequency control signal by the stabilizing control signal to develop a modified first frequency control signal for application to said digital oscillator to substantially stabilize the frequency of said output signal.

2. Apparatus comprising:
   a source of clock signal which exhibits frequency instabilities;
   a source of first reference signal having a predetermined frequency;
   a first digital phase locked loop, coupled to said source of clock signal including a digital oscillator responsive to said clock signal and to an input increment signal for developing an output signal which has substantially the same frequency as said first reference signal, wherein the frequency instabilities of said clock signal tend to cause corresponding frequency instabilities in said output signal;
   a source of second reference signal having a frequency that is substantially equal to a further predetermined frequency;
   a second digital phase locked loop coupled to said source of clock signal for developing an oscillatory signal which has substantially the same frequency as said second reference signal, including circuitry for developing a compensating control signal which substantially compensates said second digital phase locked loop for frequency instabilities in said clock signal and causes said oscillatory signal to be substantially independent of the frequency instabilities in said clock signal;
   first multiplying means, coupled to said second digital phase locked loop, for multiplying the compensating control signal developed thereby by a predetermined value related to the value of said further predetermined frequency to develop a scaled compensating control signal; and
   second multiplying means, coupled to said first multiplying means for multiplying said input increment signal by said scaled compensating control signal to develop a modified input increment signal for application to said digital oscillator to stabilize the frequency of said output signal.

3. The apparatus set forth in claim 2 wherein:
   said first digital phase locked loop includes:
   an input terminal for applying a reference signal;
   a first discrete time oscillator responsive to said clock signal and to said input increment signal for developing said output signal having substantially the same frequency as said first reference signal;
   means, including first phase comparison means, coupled to said source of first reference signal and to said first discrete time oscillator for developing a signal representing the difference in phase between said first reference signal and said output signal; and
   means coupled to said first phase comparison means for combining the signal developed thereby with a signal having a predetermined value to develop said increment signal for application to said discrete time oscillator; and
   said second multiplying means includes a signal multiplier having a first input port coupled to receive the output signal of said first multiplying means, a second input port coupled to receive said input increment signal, and an output port coupled to apply the modified input increment signal provided thereby to said discrete time oscillator as said input increment signal.

4. The circuitry set forth in claim 3 wherein:
   said means for developing said second reference signal includes:
   a crystal oscillator for developing an output signal having a frequency substantially equal to said further predetermined frequency; and
   an analog to digital converter coupled to said crystal oscillator and to said source of clock signal for developing digital samples representing said second reference signal, said samples having values representing the values of the signal provided by said crystal oscillator at instants in time determined by said clock signal; and
   said second digital phase locked loop includes:
   a second discrete time oscillator responsive to said clock signal and to said compensating control signal for developing said oscillatory signal having substantially the same frequency as said second reference signal;

means, including second phase comparison means coupled to said analog to digital converter and to said second discrete time oscillator for developing a signal representing the difference in phase between said second reference signal and said oscillatory signal; and means coupled to said second phase comparison means for combining the signal provided thereby with a signal having a predetermined value to develop a signal for application to said second discrete time oscillator and to said first multiplying means as said compensating control signal.

5. A digital television signal processing system comprising:

an input terminal for applying composite video signal, including horizontal line synchronizing signal components and chrominance signal components including a color reference burst signal component;

a first phase locked loop responsive to said composite video signals and having a predetermined loop time constant for generating a sampling clock signal that is locked in phase to said horizontal line synchronizing signal components, wherein said sampling clock signal exhibits frequency instabilities;

a second phase locked loop, responsive to said composite video signals and having a loop time constant that is substantially greater than that of the first phase locked loop for developing an output signal that has substantially the same frequency as the color reference burst signal component of said composite video signals, wherein said output signal tends to exhibit frequency instabilities corresponding to the frequency instabilities in said clock signal;

means for developing a reference signal having a predetermined frequency;

a third phase locked loop, responsive to said reference signal and to said clock signal and having a loop time constant that is not substantially greater than that of said first phase locked loop, for developing an oscillatory signal that is locked in frequency to said reference signal, wherein said third phase locked loop includes circuitry for developing a control signal that is proportional to the difference in frequency between said reference signal and said oscillatory signal;

signal multiplying means, coupled to said third phase locked loop for multiplying said control signal by a predetermined factor inversely proportional to said predetermined frequency to develop a stabilizing control signal having a nominal value of unity and exhibiting changes in value corresponding to the frequency instabilities exhibited by said sampling clock signal; and means coupled to said third phase locked loop for applying the stabilizing control signal developed by said signal multiplying means to said second phase locked loop to substantially compensate said second phase locked loop for frequency instabilities in said output signal related to said clock signal.

6. The circuitry set forth in claim 5 wherein:
said second phase locked loop includes:
a synchronizing signal input terminal for applying input signals including the color reference burst signal component of said composite video signals;
a discrete time oscillator responsive to said clock signal and to an input increment signal for developing said output signal having substantially the same frequency as said color reference burst signal;

means including phase comparison means coupled to said synchronizing signal input terminal and to said discrete time oscillator, for developing a signal representing the difference in phase between said color reference burst signal and said output signal; and means coupled to said phase comparison means for combining the signal provided thereby with a signal having a predetermined value to develop said input increment signal for application to said discrete time oscillator; and said means for applying said stabilizing control signal includes means for multiplying the signal provided by said combining means by said stabilizing control signal to produce a modified input increment signal for application to said discrete time oscillator.

7. The circuitry set forth in claim 6 wherein:
said means for developing said reference signal includes:
a crystal oscillator for developing an output signal having a frequency substantially equal to said predetermined frequency; and
an analog to digital converter coupled to said crystal oscillator and responsive to said clock signal for developing digital samples representing said reference signal, said samples representing the values of the signal provided by said crystal oscillator at instants in time determined by said clock signal;

said third phase locked loop includes:
a further discrete time oscillator responsive to said clock signal and to a further input increment signal for developing said oscillatory signal having substantially the same frequency as said reference signal;
means including further phase comparison means coupled to said analog to digital converter and to said further discrete time oscillator for developing a signal representing the difference in phase between said further reference signal and said oscillatory signal; and
means coupled to said further phase comparison means for combining the signal provided thereby with a signal having a predetermined value to develop a signal for application to said further discrete time oscillator as said further input increment signal and to said signal multiplying means said stabilizing control signal.

8. Apparatus comprising:
a source of clock signal, the instantaneous frequency of which varies about a nominal clock frequency;
a source of first reference signal having a predetermined frequency;
a digital oscillator responsive to said clock signal and to a frequency control signal for developing an output signal having substantially the same frequency as said first reference signal, wherein the variations in the frequency of said clock signal tend to induce corresponding variations in the frequency of said output signal;
a source of second reference signal having a frequency substantially equal to a further predetermined frequency;
a digital phase locked loop, including:

a further digital oscillator responsive to said clock signal and to a further frequency control signal for developing an oscillatory signal being substantially locked in phase to said second reference signal, wherein the variations in the frequency of said clock signal tend to induce corresponding variations in the frequency of said oscillatory signal;

means, including phase comparison means, coupled to said source of second reference signal and to said further digital oscillator for developing said further frequency control signal which tends to compensate said further digital oscillator for the frequency variations in said oscillatory signal that are induced by the frequency variations in said clock signal;

multiplying means, coupled to said phase comparison means for multiplying said further frequency control signal by a predetermined factor proportional to the ratio of said nominal clock frequency to the frequency of said second reference signal, to produce a stabilizing control signal; and signal combining means, coupled to said multiplying means and to said digital oscillator for combining said frequency control signal and said stabilizing control signal to produce a modified frequency control signal for application to said digital oscillator for substantially compensating said digital oscillator for the variations in the frequency of said output signal that are induced by the variations in the frequency of said clock signal.

9. The apparatus set forth in claim 8 wherein, said signal combining means includes a digital multiplier for multiplying said frequency control signal by said stabilizing control signal to produce said modified frequency control signal.

* * * * *